United States Patent
Yamaguchi et al.

(10) Patent No.: US 7,286,202 B2
(45) Date of Patent: Oct. 23, 2007

(54) IMAGE DISPLAY AND MANUFACTURING METHOD THEREOF HAVING PARTICULAR INTERNAL WIRING STRUCTURE

(75) Inventors: Takehisa Yamaguchi, Kumamoto (JP); Hironori Aoki, Kumamoto (JP)

(73) Assignee: Kabushiki Kaisha Advanced Display, Kumamoto (JP)

( * ) Notice: Subject to any disclaimer, the term of this patent is extended or adjusted under 35 U.S.C. 154(b) by 0 days.

(21) Appl. No.: 11/518,171

(22) Filed: Sep. 11, 2006

(65) Prior Publication Data

US 2007/0002255 A1    Jan. 4, 2007

Related U.S. Application Data

(62) Division of application No. 10/327,906, filed on Dec. 26, 2002, now Pat. No. 7,113,246.

(30) Foreign Application Priority Data

Dec. 28, 2001  (JP)  ............ P2001-400383
Feb. 25, 2002  (JP)  ............ P2002-048293

(51) Int. Cl.
  *G02F 1/1345*  (2006.01)
  *G02F 1/1343*  (2006.01)
  *G09G 3/36*   (2006.01)
(52) U.S. Cl. .......... 349/152; 349/148; 349/147; 349/151; 345/98
(58) Field of Classification Search ......... 349/147, 349/152, 149, 151, 148; 345/98
See application file for complete search history.

(56) References Cited

U.S. PATENT DOCUMENTS

| 5,739,887 | A | * | 4/1998 | Ueda et al. ............. 349/149 |
| 5,748,179 | A | | 5/1998 | Ito et al. |
| 5,825,449 | A | | 10/1998 | Shin |
| 5,847,796 | A | | 12/1998 | Uchiyama et al. |
| 6,388,722 | B1 | * | 5/2002 | Yoshii et al. ............ 349/62 |
| 6,411,359 | B1 | * | 6/2002 | Kobayashi et al. ...... 349/149 |
| 6,518,630 | B2 | | 2/2003 | You et al. |
| 2001/0050799 | A1 | | 12/2001 | Murade |

(Continued)

FOREIGN PATENT DOCUMENTS

JP         2259728     10/1990

(Continued)

*Primary Examiner*—Mike Qi
(74) *Attorney, Agent, or Firm*—McDermott Will & Emery LLP (57) ABSTRACT

An image display in which a resistance value of internal wiring for inputting a signal and a power supply to a driving IC COG-packaged on an insulating substrate composing a display panel is reduced without enlarging external size of the display panel, and a method of manufacturing the image display. In internal wiring 8 for inputting a signal and a power supply to a driving IC 4 COG-packaged on a first insulating substrate 1, first layer internal wiring 8a is composed of a first conductive film forming a scanning line, etc., and second layer internal wiring 8b is composed of a second conductive film forming a signal line, etc. Connecting wiring 15 for connecting the first layer internal wiring 8a and the second layer internal wiring 8b is formed simultaneously with formation of a display electrode, and the internal wiring 8 is formed into a multi-layer structure connected electrically parallel.

1 Claim, 10 Drawing Sheets

U.S. PATENT DOCUMENTS

2004/0183075 A1  9/2004  Jun et al.

FOREIGN PATENT DOCUMENTS

| JP | 5-303106 | 11/1993 |
| JP | 5297396 | 11/1993 |
| JP | 6-110071 | 4/1994 |
| JP | 8-262487 | 10/1996 |
| JP | 10253991 | 9/1998 |
| JP | 11052405 | 2/1999 |
| JP | 2000019554 | 1/2000 |

* cited by examiner

PRIOR ART

IMAGE DISPLAY AND MANUFACTURING METHOD THEREOF HAVING PARTICULAR INTERNAL WIRING STRUCTURE

RELATED APPLICATIONS

This application is a divisional application of Ser. No. 10/327,906, filed Dec. 26, 2002, now U.S. Pat. No. 7,113,246, which claims priority of Japanese Patent application No. P2001-400383, filed Dec. 28, 2001 and P2002-048993, filed Feb. 25, 2002, the contents of which are herewith incorporated by reference.

BACKGROUND OF THE INVENTION

1. Field of the Invention

The present invention relates to an image display such as liquid crystal display and, more particularly, relates to an image display including internal wiring for inputting a signal and a power supply from an external circuit to a driving IC for supplying a signal to a scanning line or a signal line of a display panel on an insulating substrate composing the display panel. The invention also relates to a method of manufacturing such image display.

2. Background Art

Under the background an increasing demand for reliable and less expensive medium-sized or small-sized image displays to be used for a car navigation system and so on, it is a recent trend that a driving IC of a display panel is mounted in a package area on an insulating substrate forming an image display. This is so-called a "Chip On Glass (hereinafter referred to as COG) Packaging" employed in many cases.

In this COG package, a signal and a power supply are inputted to the driving IC through a conductive film (hereinafter referred to as internal wiring) formed in the packaging area on the insulating substrate. In designing a pattern of this internal wiring, it is essential to lay out internal wiring having a resistance value that does not cause any abnormal driving IC output in a wiring area restricted and determined depending upon the size of the image display.

One of conventional image displays having an internal wiring for inputting a signal and a power supply to a CGO-packaged driving IC mounted is hereinafter described as an example of a liquid crystal display in which a thin film transistor (hereinafter referred to as TFT) is mounted as a switching element.

Figure 15:
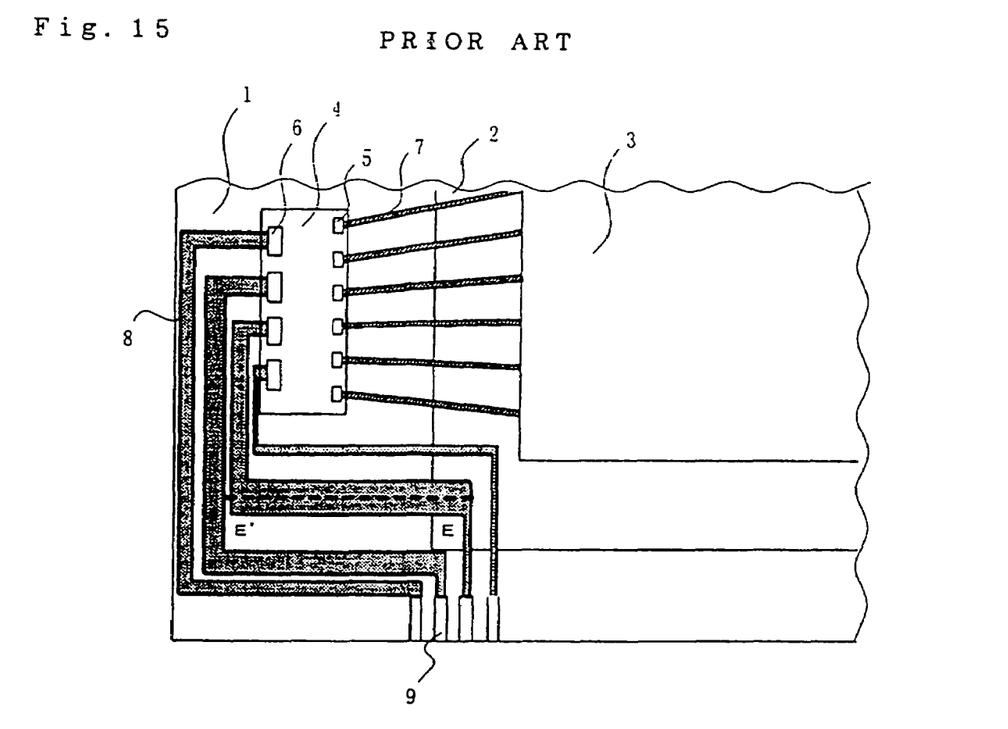
FIG. 15 is a plan view showing a part of a conventional image display of this type.
Figure 16:
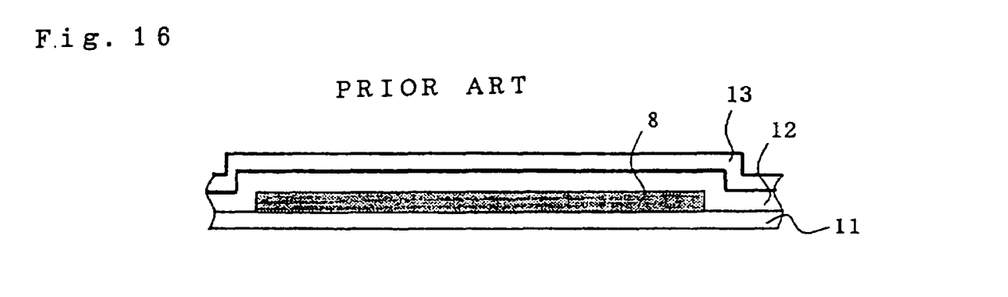
FIG. 16 is a sectional view showing a part of the conventional image display.
Figure 17:
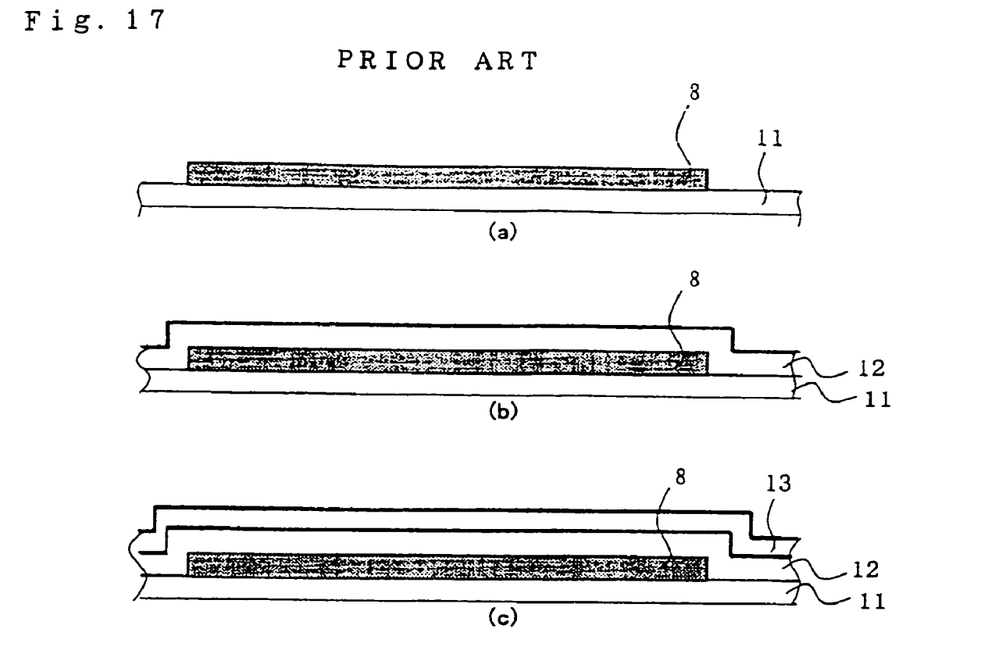

FIGS. 15, 16, and 17 respectively show the conventional liquid crystal display having the internal wiring for inputting a signal and a power supply to the CGO-packaged driving IC mounted on a TFT array substrate. FIG. 15 is a plan view showing a part (in the vicinity of the driving IC packaging area) of the conventional liquid crystal display, FIG. 16 is a sectional view taken along the line E-E in FIG. 15, and FIG. 17 is a sectional view showing a manufacturing process taken along the line E-E in FIG. 15.

In the drawings, reference numeral 1 is a TFT array substrate forming the liquid crystal display, numeral 2 is an opposed substrate being opposed to the TFT array substrate 1 and holds a liquid crystal material between the TFT array substrate 1 and the opposed substrate 2. Numeral 3 is a display area of the liquid crystal display, numeral 4 is a driving IC, numeral 5 is a driving IC output terminal, and numeral 6 is a driving IC input terminal. Numeral 7 is wiring for connecting the driving IC to a scanning line (gate wiring) or a signal line (source wiring), numeral 8 is internal wiring for inputting a signal and a power supply from an external circuit to the driving IC, and numeral 9 is a connecting terminal on the substrate side where a signal and a power supply from the external circuit are supplied. Numeral 11 is an insulating substrate (glass substrate), numeral 12 is a first insulating film (gate insulating film), and numeral 13 is a second insulating film (passivation film).

A manufacturing process is hereinafter described. First, a metal such as Cr to serve as a first conductive film is accumulated 0.1 to 1.0 μm through sputtering on the insulating substrate 11 such as glass substrate and patterned by photoengraving and etching. Thus the internal wiring 8 and a gate electrode and gate wiring (not shown) of a TFT are formed (FIG. 17(a)).

Next, the first insulating film (gate insulating film) 12, a non-doped amorphous semiconductor film, and an amorphous semiconductor film where an n-type impurity is doped are successively accumulated through CVD. The non-doped amorphous semiconductor film and the amorphous semiconductor film where the n-type impurity is doped are patterned by photoengraving and etching, whereby a semiconductor layer and a contact layer (not shown) are formed. Furthermore, a metal such as Cr to serve as a second conductive film is accumulated 0.1 to 1.0 μm through sputtering and patterned by photoengraving and etching. Thus a source/drain electrode and source wiring (not shown) of the TFT are formed. At this stage, only the first insulating film 12 remains in the portion where the internal wiring 8 is formed (FIG. 17(b)).

Subsequently, the second insulating film (the passivation film) 13 is accumulated through CVD (FIG. 17(c)).

Then, contact holes (not shown) are formed on the first insulating film (gate insulating film) 12 and the second insulating film (passivation film) 13. Finally, ITO to serve as a transparent conductive film is accumulated through sputtering so as to cover the contact holes and patterned by photoengraving and etching, whereby a display electrode (not shown) connected to the drain electrode through the contact hole and wiring (not shown) connecting the first conductive film and the second conductive film through the contact hole are formed. Thus, a TFT array substrate is formed through the foregoing process.

The internal wiring for inputting a signal and a power supply to the driving IC is classified into a signal system and a power supply system. Approximately ten in total of wiring are laid down for shift resistor clock, wiring for start pulse, etc. in the signal system, and for a level shifter, an output buffer power supply VGG, a ground power supply VEE, a logic power supply VDD, etc. in the power supply system. A standard resistance value of each internal wiring is not larger than several kΩ in the case of the signal system, and not larger than several hundreds Ω in the case of the power supply system. A signal and a power supply to be inputted to the driving IC are inputted from external circuit through a connecting terminal on the TFT array substrate.

As described above, in the case of laying out the internal wiring for inputting a signal and a power supply to the COG-packaged driving IC mounted in the packaging area on the TFT array substrate, a wiring width of each internal wiring is estimated based on the resistance value that does not cause any abnormal driving IC output, and width of the COG packaging area is restricted by external size of the display panel depending upon the product specification. Therefore a problem exists in the conventional liquid crystal display that it is necessary to enlarge the external size of the display panel in order to obtain a resistance value of the internal wiring that satisfies the display properties. Another problem exists in that in a case where external size of the display panel takes priority to the resistance value of the internal wiring, increase in internal wiring resistance value gives a negative influence on the display properties.

SUMMARY OF THE INVENTION

The present invention was made to solve the above-discussed problems and has an object of obtaining an image display in which a resistance value of internal wiring for inputting a signal and a power supply to a COG-packaged driving IC is reduced without enlarging external size of a display panel. The invention also provides a manufacturing method suitable for this image display.

In an image display according to the invention, a driving IC for driving an image display portion is packaged on an insulating substrate where the image display portion is formed, and internal wiring for inputting a signal and a power supply from an external circuit to this driving IC is formed. In such arrangement, at least a part of the internal wiring has a multi-layer structure in which conductive films of different layers are connected so as to be electrically parallel to each other.

As a result, it is possible to reduce a resistance value of the internal wiring without enlarging the area where the internal wiring is laid down, i.e., without enlarging the external size of the display panel. Thus it is possible to provide a small and light image display without drop in display quality.

In another image display according to the invention, a driving IC for driving an image display portion is packaged on an insulating substrate where the mentioned image display portion is formed, and internal wiring for inputting a signal and a power supply from an external circuit to this driving IC is formed. In such arrangement, the mentioned internal wiring includes a power-supply input internal wiring for inputting a power supply to the mentioned driving IC and a signal input internal wiring for inputting a signal thereto, and the mentioned power-supply input internal wiring and the mentioned signal input internal wiring are composed of conductive films of different layers through an insulating film.

As a result, it is possible to provide an image display that restrains enlarging of the area where the internal wiring is installed and restrains short-circuit of adjacent internal wiring.

In a method of manufacturing an image display according to the invention in which a driving IC for driving an image display portion is packaged on an insulating substrate where the mentioned image display portion is formed, and internal wiring for inputting a signal and a power supply from an external circuit to this driving IC is formed, the method includes the steps of: composing at least a part of the internal wiring to be conductive films of multi-layer structure connected through insulating films; and connecting the conductive films of different layers of multi-layer structure so as to be electrically parallel to each other.

As a result, it is possible to reduce a resistance value of the internal wiring without enlarging the area where the internal wiring is laid down, i.e., without enlarging the external size of the display panel. Thus it is possible to provide a small and light image display without drop in display quality.

In another method of manufacturing an image display according to the invention including an insulating substrate where an image display portion is formed, an image display electrode formed in the image display portion on the insulating substrate, a scanning line formed in the image display portion on the insulating substrate, a signal line crossing the scanning line through an insulating film, and internal wiring for inputting a signal and a power supply from an external circuit to a driving IC that is mounted on the insulating substrate and supplies a signal to the scanning line or the signal line, the method includes the steps of: forming the internal wiring to be conductive films of a multi-layer structure simultaneously with formation of the scanning line and the signal line; and connecting the conductive films of different layers of the internal wiring so as to be electrically parallel to each other.

As a result, it is possible to arrange the internal wiring into two layers without changing the conventional manufacturing process.

BRIEF DESCRIPTION OF THE DRAWINGS

FIGS. 3(*a*) to (*f*) are sectional views each showing a process of manufacturing internal wiring in the image display according to Embodiment 1 of the invention.

FIGS. 9(*a*) to (*c*) are sectional views each showing a process of manufacturing internal wiring in the image display according to Embodiment 4 of the invention.

FIGS. 17(*a*) to (*c*) are sectional views each showing a process of manufacturing internal wiring in the conventional image display.

DESCRIPTION OF THE PREFERRED EMBODIMENTS

Embodiment 1

Figure 1:
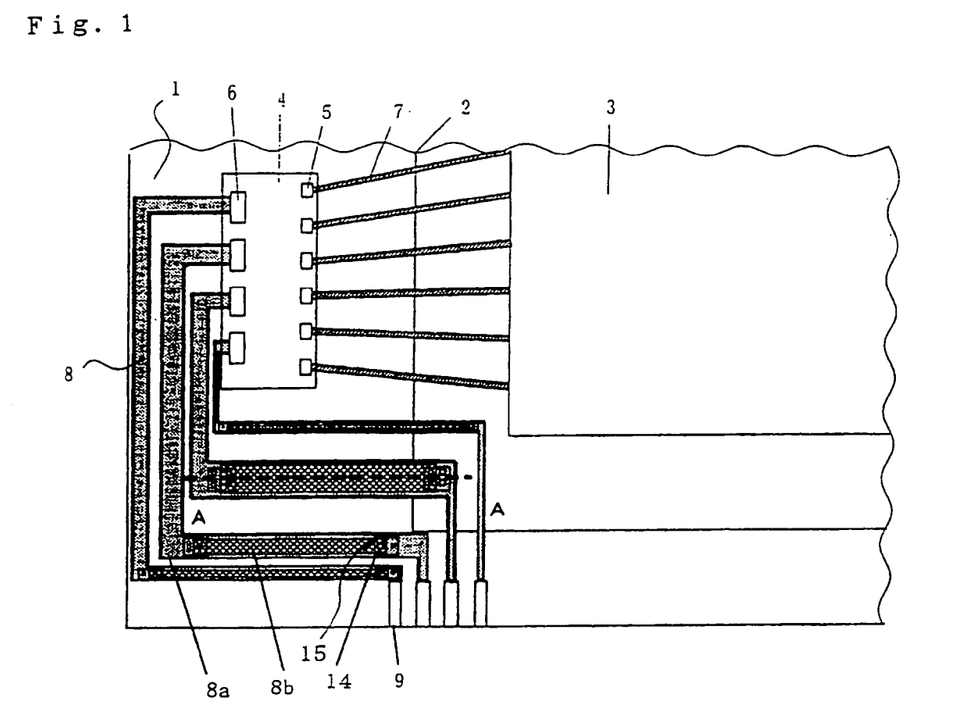
FIG. 1 is a plan view showing a part of an image display according to Embodiment 1 of the invention.
Figure 2:
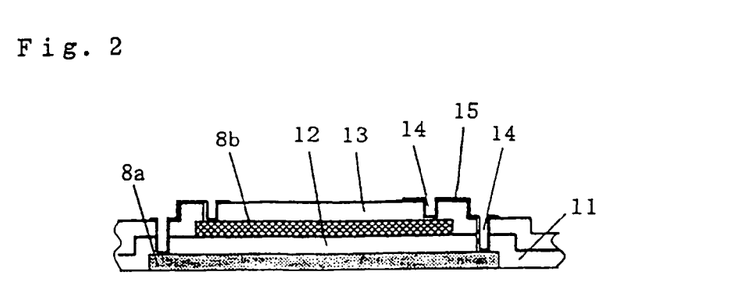
FIG. 2 is a sectional view showing a part of the image display according to Embodiment 1 of the invention.

An image display according to an embodiment of the invention is hereinafter described with reference to the drawings. FIG. 1 is a plan view showing a part of the image display (liquid crystal display in this embodiment) according to Embodiment 1 of the invention, and FIG. 2 is a sectional view taken along the line A-A in FIG. 1. FIGS. 3(a) to (f) are sectional views each showing a manufacturing process taken along the line A-A in FIG. 1.

In the drawings, reference numeral 1 is a first substrate (TFT array substrate in this embodiment) forming the image display (the liquid crystal display in this embodiment). Numeral 2 is a second substrate (opposed substrate in this embodiment) opposed to the TFT array substrate 1, and a liquid crystal material is held between the TFT array substrate 1 and the opposed substrate 2. Numeral 3 is a display area of the image display, numeral 4 is a COG-packaged driving IC mounted in the packaging area on the TFT array substrate 1. Numeral 5 is a driving IC output terminal, numeral 6 is a driving IC input terminal, and numeral 7 is wiring for connecting the driving IC 4 to a scanning line (gate wiring in this embodiment) or a signal line (source wiring in this embodiment). Numeral 8 is a conductive film (hereinafter referred to as internal wiring) that is formed in the packaging area on the TFT array substrate 1 to input a signal and a power supply from an external circuit to the driving IC 4. Numeral 8a is first layer internal wiring, and numeral 8b is second layer internal wiring. Numeral 9 is a connecting terminal on the substrate side to which a signal and a power supply are supplied from the external circuit. Numeral 11 is an insulating substrate, numeral 12 is a first insulating film (gate insulating film in this embodiment), and numeral 13 is a second insulating film. Numeral 14 is a contact hole formed on the first insulating film 12 and the second insulating film 13, and numeral 15 is connection wiring composed of a third conductive film (transparent conductive film in this embodiment).

Figure 3:
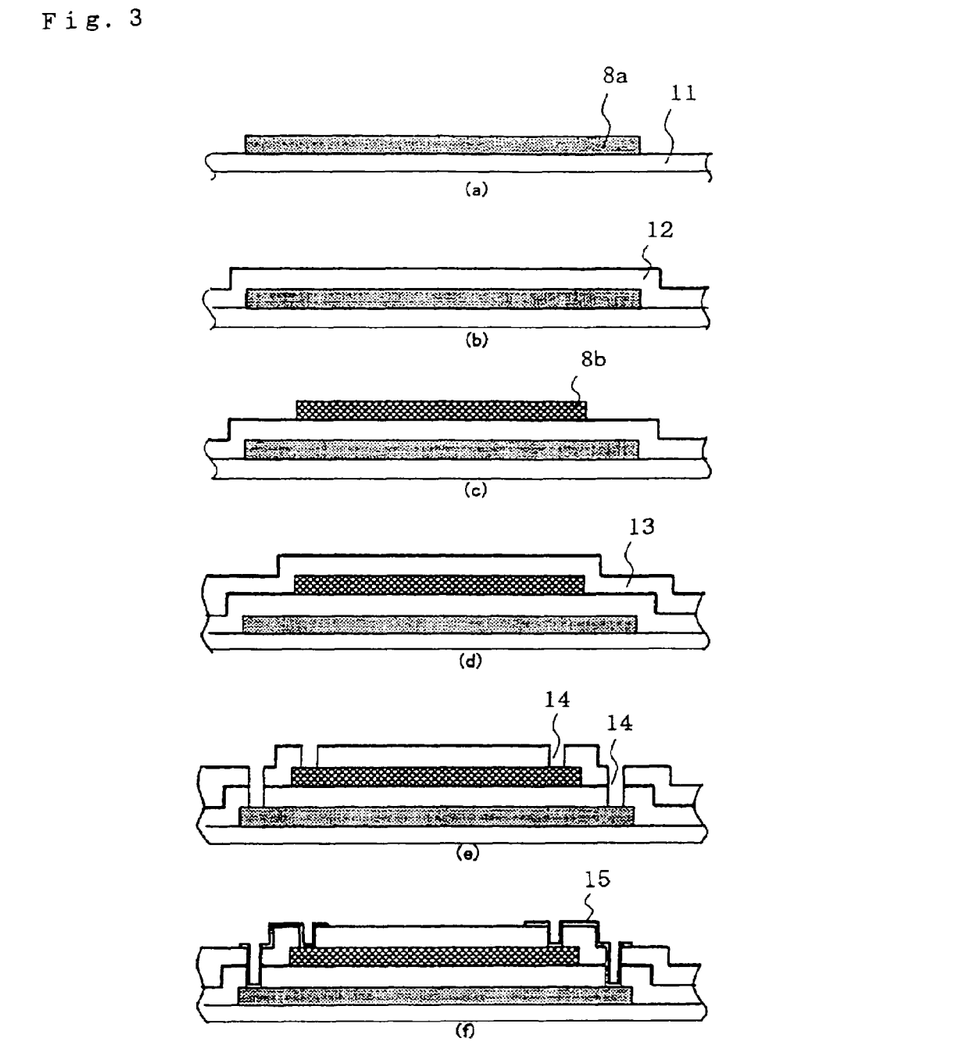

Now, a manufacturing process of the TFT array substrate having internal wiring for driving IC input of the liquid crystal display according to this embodiment is hereinafter described with reference to FIG. 3.

First, a metal such as Cr to be formed into a first conductive film is accumulated through sputtering on the insulating substrate 11 such as glass substrate and patterned by photoengraving and etching. Then, the first layer internal wiring 8a as well as a gate electrode and gate wiring (not shown) of TFT is formed (FIG. 3(a)). In this state, the first layer internal wiring 8a is formed on the same layer as the gate wiring.

Next, the first insulating film (the gate insulating film) 12, a non-doped amorphous semiconductor film, and an amorphous semiconductor film into which an n-type impurity is doped are successively accumulated through CVD. The non-doped amorphous semiconductor film and the amorphous semiconductor film into which n-type impurity is doped are patterned into an island by photoengraving and etching. Thus a semiconductor layer and a contact layer (not shown) are formed. At this stage, the amorphous silicon film is removed by etching in the area where the internal wiring 8 is formed outside the display area 3 (FIG. 3(b)).

Subsequently, a metal such as Cr to be formed into a second conductive film is accumulated through sputtering and patterned by photoengraving and etching, whereby the second layer internal wiring 8b and a source/drain electrode and source wiring (not shown) of the TFT are formed. In this state, the second layer internal wiring 8b is formed on the same layer as the source wiring.

Then, the second insulating film 13 is accumulated through CVD method (FIG. 3(d)).

Subsequently, the contact holes 14 are formed on the first insulating film (the gate insulating film) 12 and the second insulating film 13, and a part of a pattern composed of the first conductive film and a pattern composed of the second conductive film is exposed (FIG. 3(e)).

Finally, the third conductive film (transparent conductive film) is accumulated through sputtering so as to cover the contact holes 14 and patterned by photoengraving and etching. A display electrode (not shown) connected to the drain electrode through the contact hole 14 and wiring for connecting respectively the pattern composed of the first conductive film and the pattern composed of the second conductive film through the contact hole 14 are formed. The connecting wiring 15 composed of the third conductive film (transparent conductive film) connects the first layer internal wiring 8a and the second layer internal wiring 8b so that both internal wiring 8a and 8b are electrically parallel to each other (FIG. 3(f)). The TFT array substrate 1, in which the TFT is arranged and formed into a matrix, is formed through the mentioned process.

In addition, the area in which the internal wiring 8 is connected in electrically parallel to be two layers can be formed at any region of the whole or part of the internal wiring 8 as required depending upon the place where the contact hole 14 is formed.

Thus, in this embodiment, at least a part of the internal wiring 8 for inputting a signal and a power supply to the driving IC COG-packaged on the TFT array substrate 1 has a multi-layer structure in which the conductive films of different layers are connected so as to be electrically parallel to each other. As a result, it is possible to reduce a resistance value of the internal wiring 8 without enlarging the area where the internal wiring 8 is laid down, i.e., without enlarging external size of the display panel.

The first layer internal wiring 8a is formed at the same time on the same layer as the gate wiring (scanning line) of the TFT and so on. The second layer internal wiring 8b is formed at the same time on the same layer as the source wiring (the signal line) of the TFT and so on. The connecting wiring 15 connecting the first layer internal wiring 8a and the second layer internal wiring 8b is formed at the same time as the formation of the display electrode. As a result, without changing the conventional manufacturing process, it is possible to form the internal wiring 8 into two layers.

In the case of forming the internal wiring into two layers, instead of composing the two layers of the first layer internal wiring 8a and the second layer internal wiring 8b as described above, it is also preferable to compose the two layers of the second layer internal wiring 8b and the third conductive film 15. Moreover, in forming the mentioned two-layer structure, it is also preferable that the second layer internal wiring 8b and the third conductive film 15 are not connected through the insulating film, but are directly connected.

Instead of forming the internal wiring is formed into two layers, it is also preferable that, for example, referring to FIG. 2, the third conductive film 15 composed of a transparent conductive film extends onto the internal wiring so that the internal wiring is formed into three layers.

Figure 4:
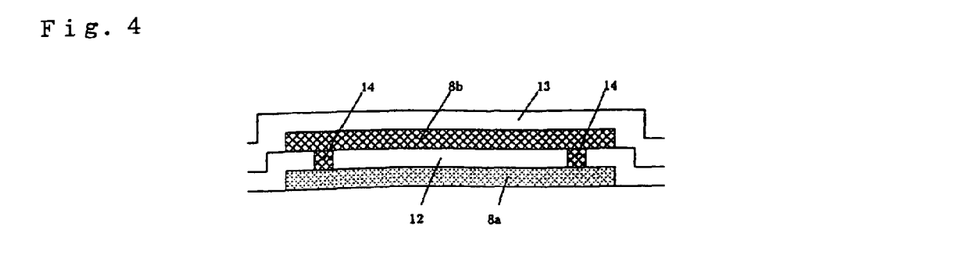
FIG. 4 is a sectional view showing another example of connecting the internal wiring in the image display according to Embodiment 1 of the invention.

The foregoing embodiment shows an example in which the first layer internal wiring 8a and the second layer internal wiring 8b are connected through the connecting wiring 15. However, it is also preferable that, for example, as shown in FIG. 4, the second layer internal wiring 8b is directly connected through the contact hole 14 provided in the insulating film 12 on the first layer internal wiring 8a.

Also in this case, it is preferable to form the internal wiring into three layers by forming a conductive film simultaneously with the formation of the display electrode on the layer upper than the second layer internal wiring 8b or between the first layer internal wiring 8a and the second layer internal wiring 8b.

Embodiment 2

Figure 5A:
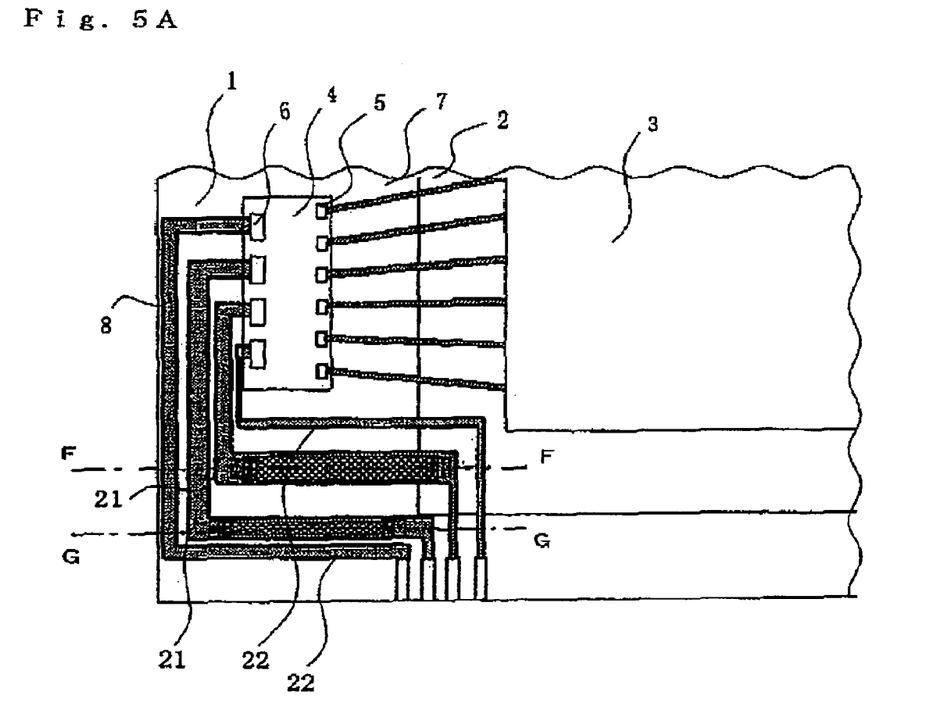
FIG. 5A is a plan view showing a part of an image display according to Embodiment 2 of the invention.
Figure 5B:
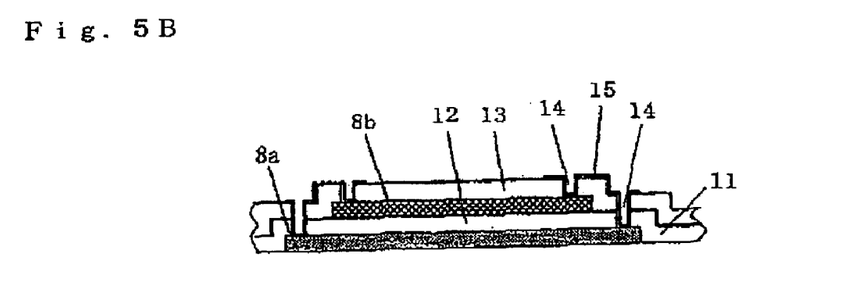
FIG. 5B is a cross sectional view of a power-supply input terminal wiring along line F-F of FIG. 5A.
Figure 5C:
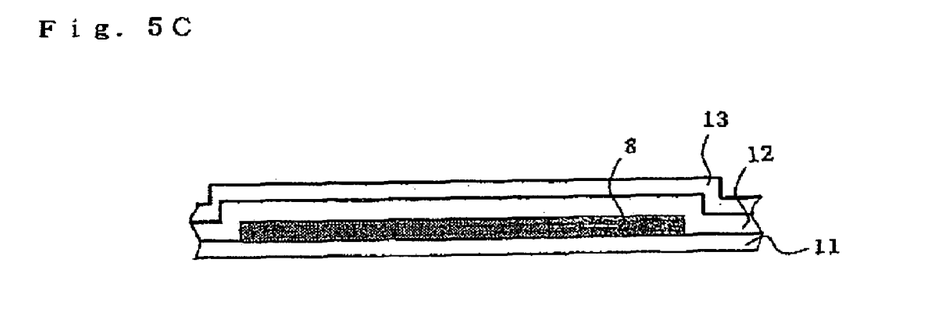
FIG. 5C is a cross sectional view of a signal input internal wiring along line G-G of FIG. 5A.

FIG. 5A is a plan view showing a part of an image display (liquid crystal display in this embodiment) according to Embodiment 2 of the invention. In the drawing, numeral 21 is internal wiring for inputting a power supply, and numeral 22 is internal wiring for inputting a signal. FIG. 5B is a cross sectional view of a power-supply input terminal wiring along line F-F of FIG. 5A, and FIG. 5C is a cross sectional view of a signal input internal wiring along line G-G of FIG. 5A.

Other reference numerals, features, and manufacturing process are the same as those in the foregoing Embodiment 1, and further explanation of them is omitted herein.

In the foregoing Embodiment 1, the whole internal wiring 8 for inputting a signal and a power supply to the driving IC 4 is formed into two layers. In this embodiment, however, as shown in FIGS. 5A to 5C, the internal wiring 21 for inputting a power supply having a resistance of a small allowance value is composed of two layers, and the internal wiring 22 for inputting a signal having a resistance of a relatively large allowance value is composed of one layer. As a result, it is possible to obtain the same advantage as obtained in Embodiment 1, and it is possible to prevent an input signal waveform from distortion that may occur when the internal wiring for signal input is formed into two layers and prevent drop in display quality.

Embodiment 3

Figure 6A:
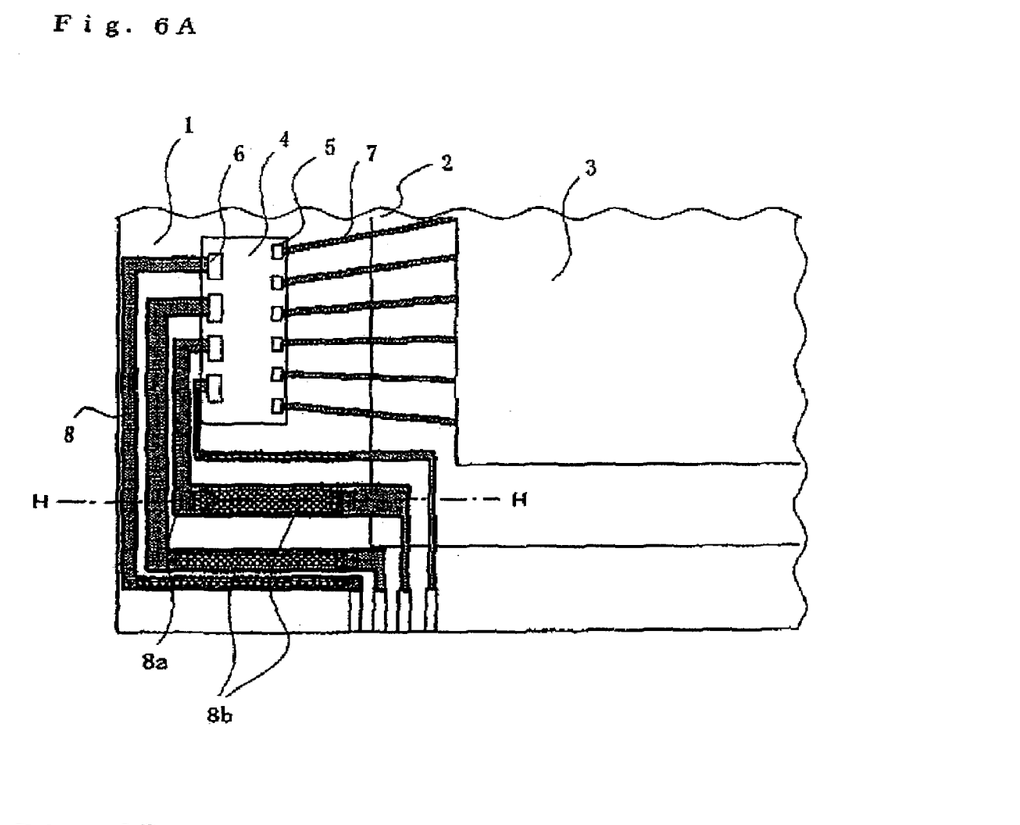
FIG. 6A is a plan view showing a part of an image display according to Embodiment 3 of the invention.
Figure 6B:
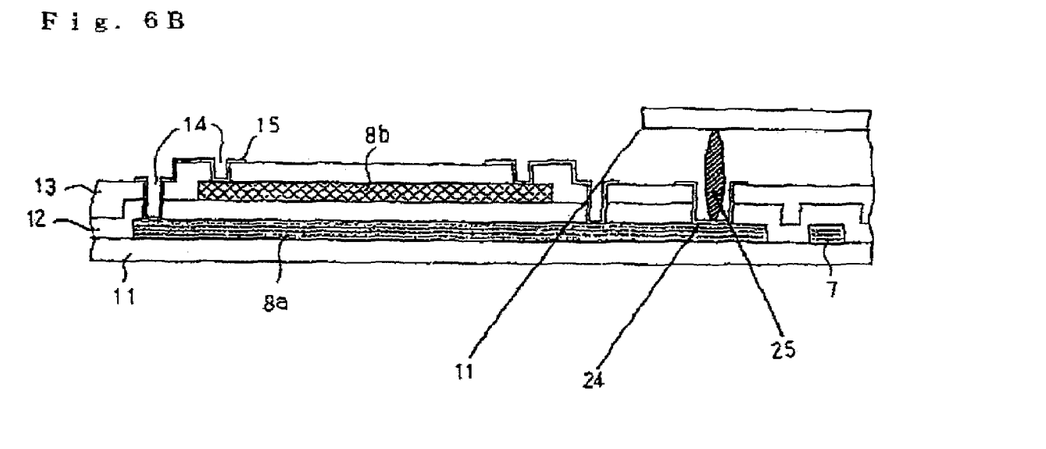
FIG. 6B is a cross sectional view of a part of an image display along line H-H of FIG. 6A.

FIG. 6A is a plan view showing a part of an image display (liquid crystal display in this embodiment) according to Embodiment 3 of the invention. FIG. 6B is a cross sectional view of a part of an image display along line H-H of FIG. 6A. In FIG. 6B, numeral 24 is a contact hole formed on the first insulating film 12 and the second insulating film 13, and numeral 25 is a conductive material such as silver paste.

The reference numerals in the drawing, features, and manufacturing process are the same as those in the foregoing Embodiment 1, and further explanation of them is omitted herein.

In the liquid crystal display according to this Embodiment 3, the internal wiring 8 is composed of one layer, i.e., either the first layer internal wiring 8a or the second layer internal wiring 8b in the area where the opposed substrate 2 is laid on the packaging area of the TFT array substrate 1. On the other hand, the internal wiring 8 is composed of two layers, i.e., the first layer internal wiring 8a and the second layer internal wiring 8b in an area where the opposed substrate 2 is not laid on the TFT array substrate 1.

Thus, in the case where the internal wiring 8 composed of two layers is formed in the area where the TFT array substrate 1 overlaps on the opposed substrate 2, it is possible to prevent occurrence of irregularity or unevenness in display caused by a gap between the TFT array substrate 1 and the opposed substrate 2 in this portion, the gap being different from that in other areas.

In this embodiment, the internal wiring 8 is composed of one layer only in the area where the opposed substrate 2 is laid on the TFT array substrate 1. As a result, it is possible to obtain the same advantage as in the foregoing Embodiment 1, and it is possible to prevent occurrence of irregularity or unevenness in display caused by difference in gap between the TFT array substrate 1 and the opposed substrate 2 and prevent deterioration in display quality.

Embodiment 4

Figure 7:
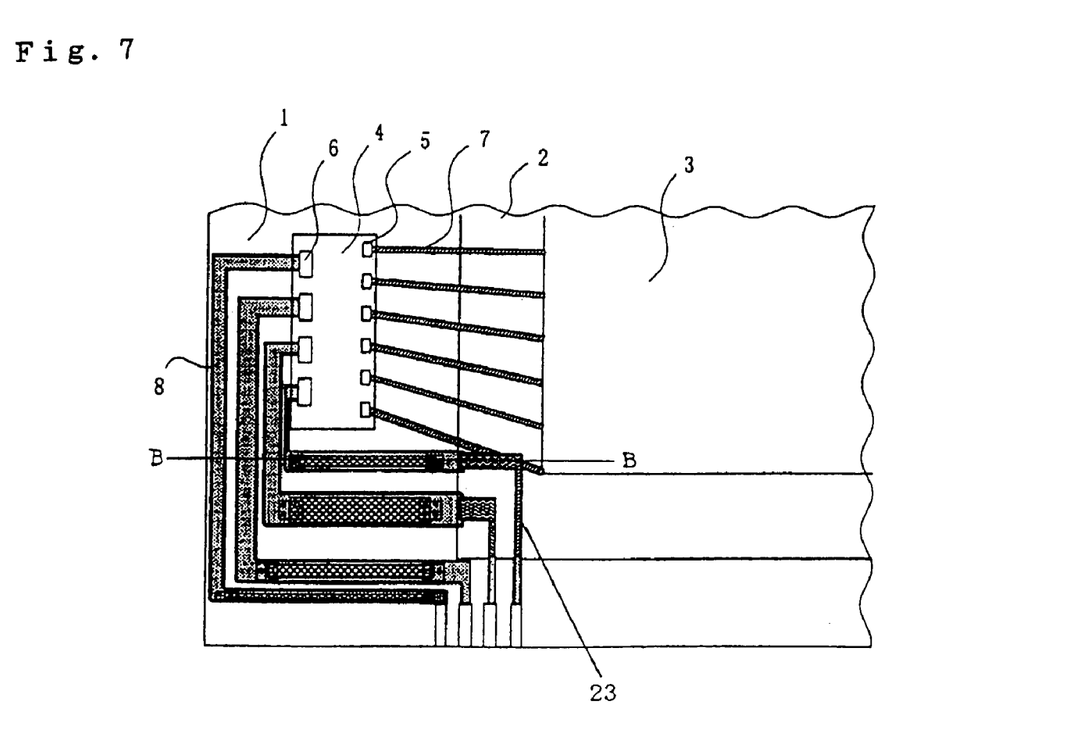
FIG. 7 is a plan view showing a part of an image display according to Embodiment 4 of the invention.
Figure 8:
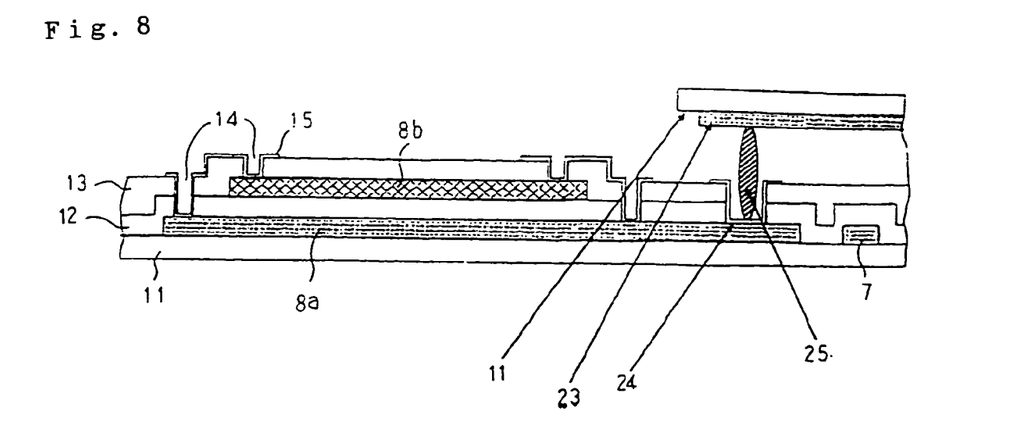
FIG. 8 is a sectional view showing a part of the image display according to Embodiment 4 of the invention.
Figure 9:
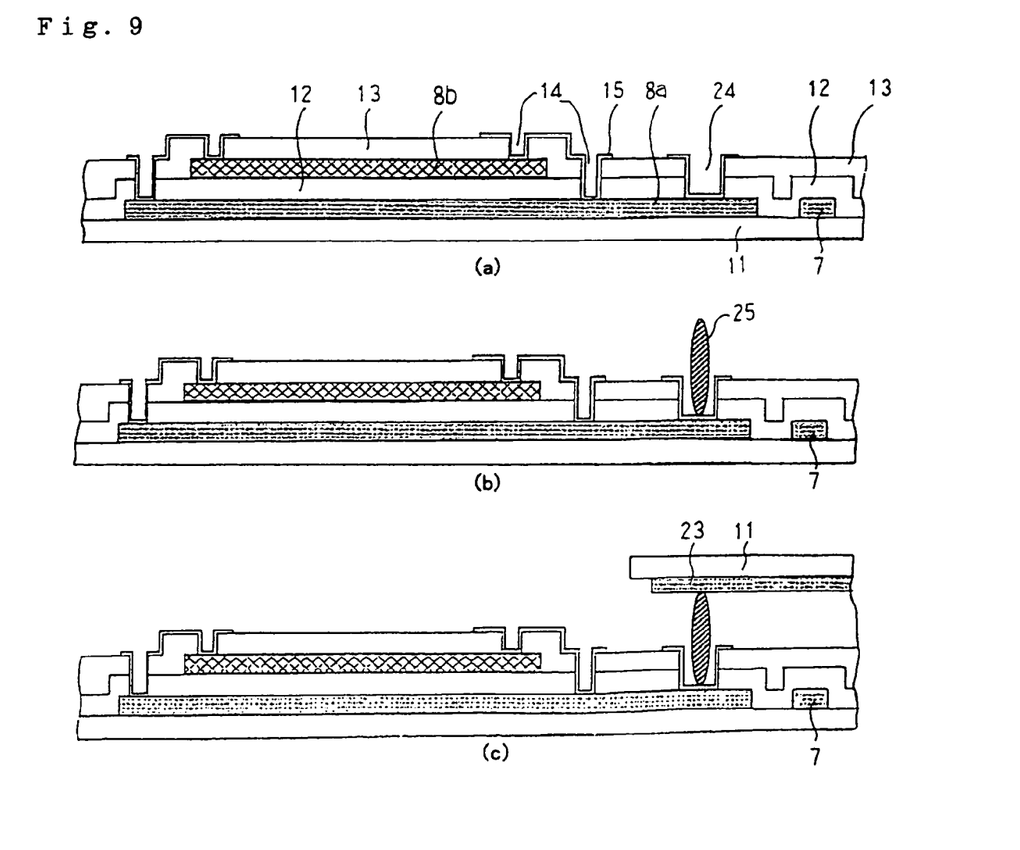

FIG. 7 is a plan view showing a part of an image display (liquid crystal display in this embodiment) according to Embodiment 4 of the invention, FIG. 8 is a sectional view taken along the line B-B in FIG. 7, and FIG. 9 is a sectional view showing a manufacturing process taken along the line B-B in FIG. 7.

In the drawings, numeral 23 is internal wiring formed on the opposed substrate 2, numeral 24 is a contact hole formed on the first insulating film 12 and the second insulating film 13, and numeral 25 is a conductive material such as silver paste.

The same reference numerals are designated to like parts as those in FIG. 1 and further explanation of them is omitted herein.

In the liquid crystal display of this embodiment, the internal wiring 23 is formed on the opposed substrate 2 in the area where the opposed substrate 2 is laid on the packaging area of the TFT array substrate 1, if required, and connected to the internal wiring 8 on the TFT array substrate 1.

Then, the manufacturing method of the display panel having internal wiring for driving IC input of the liquid crystal display according to this embodiment is hereinafter described with reference to FIG. 9.

First, in the same method as described in the foregoing Embodiment 1, the first layer internal wiring 8a composed of the first conductive film, the first insulating film (the gate insulating film) 12, the second layer internal wiring 8b composed of the second conductive film, and the second insulating film 13 are respectively formed in the packaging area of the TFT array substrate 1. Then, the contact holes 14 and the contact hole 24 are respectively formed on the first insulating film (the gate insulating film) 12 and the second insulating film 13 (FIG. 9(*a*)).

The contact hole 24 is provided on the first insulating film 12 and the second insulating film 13 on the first internal wiring 8a for the purpose of connecting the internal wiring 8 (the first internal wiring 8a) on the TFT array substrate 1 to the internal wiring 23 on the opposed substrate 2 in the area where the opposed substrate 2 overlaps the packaging area of the TFT array substrate 1.

On the opposed substrate 2, the internal wiring 23 composed of a conductive film is formed at a location where the internal wiring 23 can be connected to the internal wiring 8 formed on the TFT array substrate 1.

In the process of assembling panels, i.e., laying the opposed substrate 2 on the TFT array substrate 1, a conductive material 25 such as silver paste is applied into the contact hole 24 as shown in FIG. 9(*b*), and then the opposed substrate 2 is laid on the TFT array substrate 1. At this time, the first layer internal wiring 8a on the TFT array substrate 1 and the internal wiring 23 on the opposed substrate 2 are electrically connected through the conductive material 25 (FIG. 9(*c*)).

It is not possible to lower the resistance of the internal wiring 8 formed in the packaging area on the TFT array substrate 1. Because the position where the internal wiring 8 is formed and the wiring width are restricted by other wiring formed in the packaging area on the TFT array substrate 1 such as the wiring 7 for connecting the driving IC output terminal 5 and the gate wiring of the TFT. Therefore, in the case that any wiring that brings a restriction on the formation of the internal wiring is located in the area where the TFT array substrate 1 overlaps the opposed substrate 2, a part of the internal wiring is formed on the opposed substrate 2 and is connected to the internal wiring 8 on the TFT array substrate 1.

Thus, in this embodiment, if there is any wiring that may restrict the formation of the internal wiring 8 on the TFT array substrate 1 in the area where the opposed substrate 2 is laid on the packaging area of the TFT array substrate 1, a part of the internal wiring is formed on the opposed substrate 2 (internal wiring 23) and connected to the internal wiring 8 on the TFT array substrate 1. As a result, it is possible to reduce the restriction on layout of the internal wiring, and to lower the resistance of the internal wiring without enlarging the area where the internal wiring is formed.

Embodiment 5

In each of the foregoing embodiments, an IC chip is COG-packaged on the TFT array substrate 1. The same advantages are achieved by, as shown in FIG. 10, connecting a TCP film 26, where the driving IC 4 is mounted, to the TFT array substrate 1 and applying the foregoing embodiments to the internal wiring 8 formed in the packaging area of the TFT array substrate 1 for the purpose of inputting a signal and a power supply to the driving IC 4.

Figure 10:
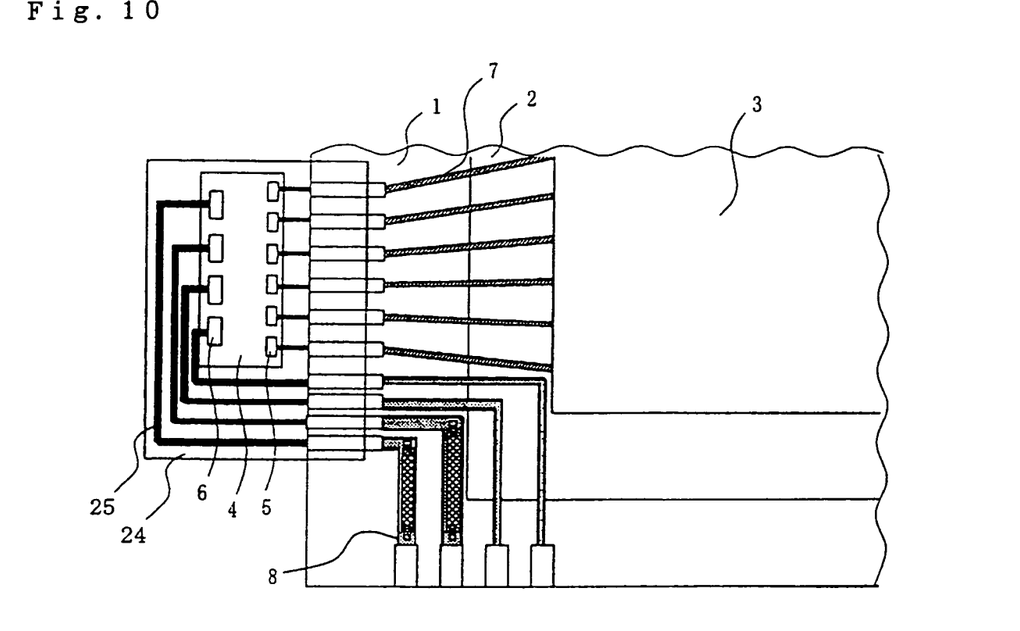
FIG. 10 is a plan view showing a part of an image display according to Embodiment 5 of the invention.

In FIG. 10, numeral 26 is a TCP tape where the driving IC is mounted, and numeral 27 is input/output wiring for the driving IC formed on the TCP tape. Other reference numerals are the same as those in Embodiment 1, and further explanation of them is omitted herein.

Embodiment 6

Figure 11:
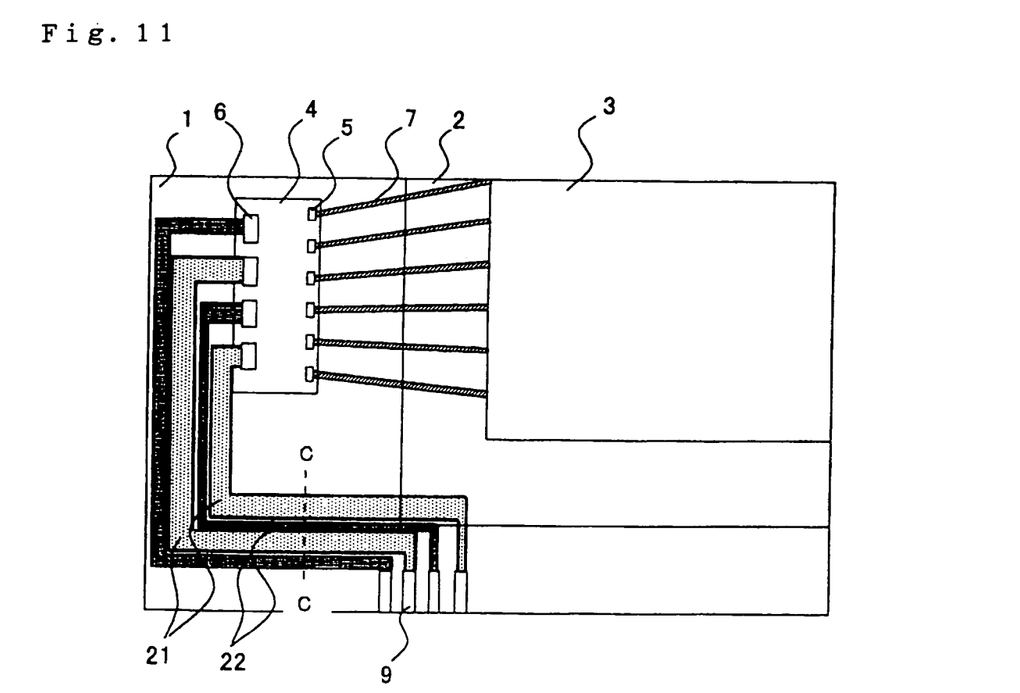
FIG. 11 is a plan view showing a part of an image display according to Embodiment 6 of the invention.
Figure 12:
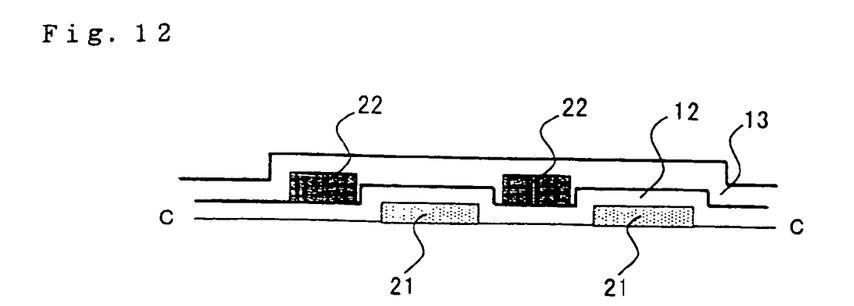
FIG. 12 is a sectional view showing a part of the image display according to Embodiment 6 of the invention.
Figure 13:
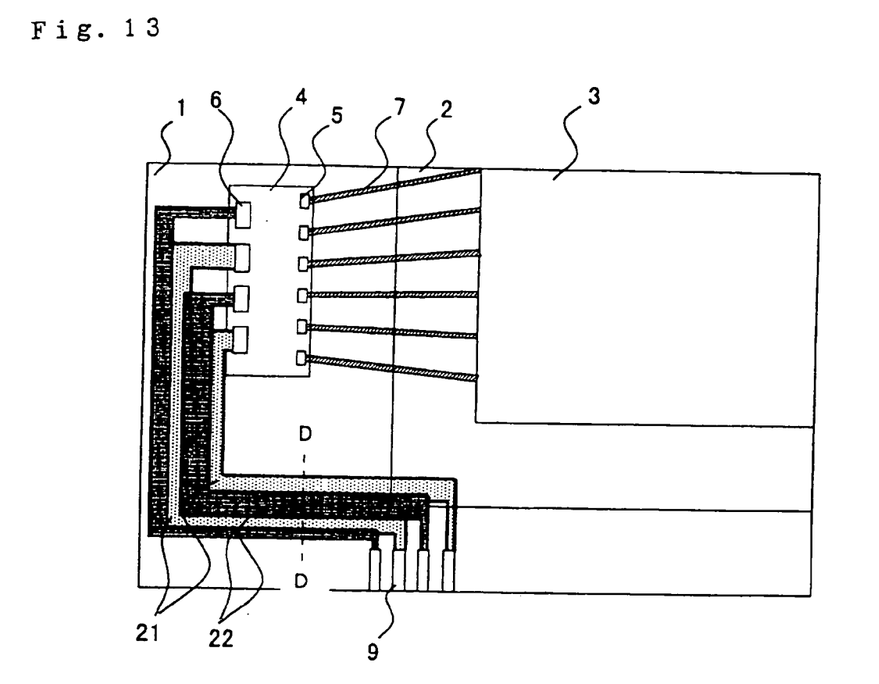
FIG. 13 is a plan view showing a part of the image display according to Embodiment 6 of the invention.
Figure 14:
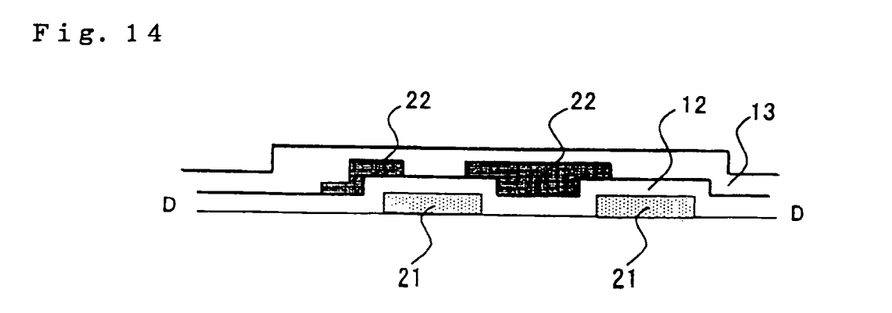
FIG. 14 is a sectional view showing a part of the image display according to Embodiment 6 of the invention.

FIG. 11 is a plan view showing a part of an image display (liquid crystal display in this embodiment) according to Embodiment 6 of the invention, and FIG. 12 is a sectional view taken along the line C-C in FIG. 11. FIG. 13 is a plan view showing a part of the image display (liquid crystal display in this embodiment) according to Embodiment 6 of the invention, and FIG. 14 is a sectional view taken along the line D-D in FIG. 13. Referring to FIGS. 11 to 14, the same reference numerals are designated to the same parts as those in FIGS. 1 to 10, and further explanation of them is omitted herein.

Referring to FIG. 11 and FIG. 12, unlike the foregoing embodiments, the internal wiring does not have any multilayer structure, and the power-supply input internal wiring 21 and the signal input internal wiring 22 are formed into different layers connected through the insulating film 12. In FIG. 11 and FIG. 12, the power-supply input internal wiring 21 is formed of the first conductive film composing the gate wiring. After forming the gate insulating film 12, the signal input internal wiring 22 is formed of the second conductive film composing the source wiring. The power-supply input internal wiring 21 and the signal input internal wiring 22 are arranged two-dimensionally close to each other through the insulating film so as not to overlap each other. As a result of such arrangement, there is less possibility of short-circuit occurring at the adjacent wiring between the power-supply input internal wiring 21 and the signal input internal wiring 22. Furthermore, since it is possible to arrange the power-supply input internal wiring 21 and the signal input internal wiring 22 two-dimensionally close to each other, it is possible to reduce the area where the internal wiring is formed.

Also in FIG. 13 and FIG. 14, unlike the foregoing embodiments, the internal wiring does not have any multilayer structure, and the power-supply input internal wiring 21 and the signal input internal wiring 22 are formed into different layers connected through the insulating film 12. Referring to FIG. 13 and FIG. 14, the power-supply input internal wiring 21 is formed of the first conductive film composing the gate wiring. After forming the gate insulating film 12, the signal input internal wiring 22 is formed of the second conductive film composing the source wiring. The power-supply input internal wiring 21 and the signal input internal wiring 22 are arranged to overlap each other through the insulating film. As a result of such arrangement, there is less possibility of short-circuit because the power-supply input internal wiring 21 and the signal input internal wiring 22 are separated by the gate insulating film. Thus it is possible to reduce the area where the internal wiring is formed because the power-supply input internal wiring 21 and the signal input internal wiring 22 are arranged to two-dimensionally overlap each other.

In this embodiment, as described above, it is certainly preferable to form the power-supply input internal wiring 21 to be wide having a resistance of a small permissible value, while forming the signal input internal wiring 22 to be narrow having a resistance of a relatively large allowable value. However, if it is particularly required to reduce the area where the internal wiring is formed, it is possible to sharply reduce the area where the internal wiring is formed by forming adjacent internal wiring of conductive films of different layers through the insulating film (for example, any odd-numbered internal wiring from one end is formed of a conductive film of the same layer, and any even-numbered internal wiring from one end is formed of a conductive film of a layer different from the layer of the foregoing odd-numbered internal wiring and is connected to the mentioned odd-numbered internal wiring through the insulating film) instead of forming the power-supply input internal wiring and the signal input internal wiring of conductive films of different layers d through an insulating film. In FIGS. 11 to 14, it is also preferable to form the signal input internal wiring 22 on the lower layer (the first conductive film) and form the power-supply input internal wiring 21 on the upper layer (the second conductive film).

The invention is not limited to the liquid crystal display of bottom-gate-type structure shown in each of the foregoing embodiments but is also applicable to a liquid crystal display of so-called top-gate-type structure in which the scanning line is laid on upper layer than the signal in the insulating substrate. In such a case, the internal wiring is formed into plural layers composed of conductive films on the same layers as the signal line and the scanning line respectively, and a signal from the external circuit is inputted to the driving IC packaged in the insulating substrate.

Furthermore, each of the foregoing embodiments is described showing an example of internal wiring in a liquid crystal display, however, the invention is not limited to that example but is applicable to any of so-called image displays inputting a signal from the external circuit to the driving IC packaged in the insulating substrate such as electro-luminescence element, a field sequential, etc.

Additional Description of the Invention

The internal wiring preferably includes power-supply input internal wiring for inputting a power supply to the driving IC and signal input internal wiring for inputting a signal. The power-supply input internal wiring has a multilayer structure in which conductive films of different layers are connected so as to be electrically parallel to each other, and the signal input internal wiring has a single-layer structure in which a conductive film is not connected to any conductive film of a different layer.

As a result of such arrangement, it is possible to prevent distortion of input signal waveform that may occur when the internal wiring for inputting a signal is formed into two layers, thereby preventing deterioration in display quality.

The image display preferably further includes an opposed substrate that is opposed to the image display portion on the insulating substrate, and the internal wiring has a single-layer structure in which a conductive film is not connected to any conductive film of a different layer in an area where the insulating substrate and the opposed substrate overlap each other. The image display has a multi-layer structure in which conductive films of different layers are connected so as to be electrically parallel to each other in the area where the insulating substrate and the opposed substrate do not overlap each other.

As a result of such arrangement, it is possible to lower restriction on layout of the internal wiring, and it is possible to lower the resistance of the internal wiring without enlarging the area where the internal wiring is formed.

The image display portion on the insulating substrate preferably further has a scanning line and a signal line formed on different layers so as to cross each other through an insulating film, and the internal wiring includes a conductive film on the same layer as the scanning line and a conductive film on the same layer as the signal line.

As a result of such arrangement, it is possible to form the internal wiring into two layers without changing the conventional manufacturing process.

The image display portion on the insulating substrate preferably further has a picture element electrode connected to the signal line, and the internal wiring is connected through a conductive film in which the conductive film on the same layer as the scanning line and the conductive film on the same layer as the signal line are formed together simultaneously with the picture element electrode.

As a result of such arrangement, it is possible to easily arrange parallel connection of the internal wiring of the multi-layer structure without changing the conventional manufacturing process.

The image display preferably further includes an opposed substrate that is opposed to the image display portion on the insulating substrate, and internal wiring is formed outside the area where the insulating substrate and the opposed electrode overlap each other, and second internal wiring is formed on a face of the opposed substrate opposed to the insulating substrate in the area where the opposed substrate and the insulating substrate overlap each other, and this second internal wiring and the internal wiring are connected through a conductive material.

As a result of such arrangement, it is possible to prevent occurrence of irregularity or unevenness in the display panel and prevent deterioration in display quality.

Connecting wiring is preferably formed simultaneously with formation of an image display electrode so that the conductive films of different layers of the multi-layer structure are electrically parallel to each other.

As a result of such arrangement, it is possible to easily arrange parallel connection of the internal wiring of the multi-layer arrangement without changing the conventional manufacturing process.

What is claimed is:

1. An image display comprising:
   a driving IC for driving an image display portion and packaged on an insulating substrate where said image display portion is formed; and
   internal wiring for inputting a signal and a power supply from an external circuit to said driving IC,
   wherein at least a part of said internal wiring has a multi-layer structure in which conductive films of different layers are connected so as to be electrically parallel to each other,
   wherein said internal wiring includes power-supply input internal wiring for inputting a power supply to the driving IC and signal input internal wiring for inputting a signal, said power-supply input internal wiring has a multi-layer structure in which conductive films of different layers are connected so as to be electrically parallel to each other, and said signal input internal wiring has a single-layer structure in which a conductive film is not connected to any conductive film of a different layer,
   the image display further comprising an opposed substrate that is opposed to said image display portion on said insulating substrate, wherein said internal wiring has a single-layer structure in which a conductive film is not connected to any conductive film of a different layer in an area where said insulating substrate and said opposed substrate overlap each other, and has a multi-layer structure in which conductive films of different layers are connected so as to be electrically parallel to each other in the area where said insulating substrate and said opposed substrate do not overlap each other.

* * * * *